(12) United States Patent
Rao et al.

(10) Patent No.: US 7,557,008 B2
(45) Date of Patent: Jul. 7, 2009

(54) METHOD OF MAKING A NON-VOLATILE MEMORY DEVICE

(75) Inventors: Rajesh Rao, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 169 days.

(21) Appl. No.: 11/625,882

(22) Filed: Jan. 23, 2007

(65) Prior Publication Data

US 2008/0176371 A1 Jul. 24, 2008

(51) Int. Cl.
*H01L 21/336* (2006.01)

(52) U.S. Cl. .......... 438/288; 438/176; 438/283; 438/514; 257/E21.18; 257/E21.679

(58) Field of Classification Search ........ 438/288, 438/176, 195, 517; 257/E21.177, E21.179, 257/E21.18
See application file for complete search history.

(56) References Cited

U.S. PATENT DOCUMENTS

| | | | |
|---|---|---|---|
| 5,397,724 | A | 3/1995 | Nakajima et al. |
| 6,281,076 | B1 | 8/2001 | Choi et al. |
| 7,164,167 | B2 | 1/2007 | Iwata et al. |
| 2002/0068446 | A1* | 6/2002 | Wu et al. .......... 438/664 |
| 2002/0132413 | A1* | 9/2002 | Chang et al. ........ 438/211 |
| 2003/0173616 | A1* | 9/2003 | Kusumi et al. ...... 257/316 |
| 2006/0008992 | A1* | 1/2006 | Shukuri ............ 438/264 |
| 2007/0232041 | A1* | 10/2007 | Choi et al. ......... 438/585 |
| 2008/0153298 | A1* | 6/2008 | Hui et al. .......... 438/703 |

OTHER PUBLICATIONS

Sadd et al; "Improved Window with a P-doped Control gate in a Nano-crystal Split-gate memory" IEEE 2006 Silicon Nanoelectronics Workshop, Jun. 2006, pp. 99-100.
PCT Search report and Written Opinion for corresponding PCT Application No. PCT/US08/50693 mailed May 30, 2008.

* cited by examiner

*Primary Examiner*—Walter L Lindsay, Jr.
*Assistant Examiner*—Cheung Lee
(74) *Attorney, Agent, or Firm*—James L. Clingan, Jr.; Robert L. King

(57) ABSTRACT

A method forms a nonvolatile memory device using a semiconductor substrate. A charge storage layer is formed overlying the semiconductor substrate and a layer of gate material is formed overlying the charge storage layer to form a control gate electrode. A protective layer overlies the layer of gate material. Dopants are implanted into the semiconductor substrate and are self-aligned to the control gate electrode on at least one side of the control gate electrode to form a source and a drain in the semiconductor substrate on opposing sides of the control gate electrode. The protective layer prevents the dopants from penetrating into the control gate electrode. The protective layer that overlies the layer of gate material is removed. Electrical contact is made to the control gate electrode, the source and the drain. In one form a select gate is also provided in the memory device.

12 Claims, 10 Drawing Sheets

METHOD OF MAKING A NON-VOLATILE MEMORY DEVICE

FIELD OF THE INVENTION

This invention relates generally to semiconductor devices, and more specifically, to non-volatile memories.

BACKGROUND

Non-volatile memories (NVMs) have a major role in current semiconductor products either as stand alone devices or embedded applications such as onboard a chip having logic. A large percentage of microcontrollers include such an NVM. Typically such NVMs have a floating gate for each memory device. An alternative becoming available is using nanocrystals for the charge storage layer which offers improved reliability but has a smaller memory window in that there is less differential between the programmed and erased states. A primary cause of this is that during erase, electrons are back-injected into the charge storage layer. For erase, the control gate, in an NMOS memory cell, which is the typical, is biased with a negative voltage with respect to the substrate to push electrons out of charge storage layer to the substrate. Since the control gate is typically doped to the same conductivity type as the source and drain, the negative bias also pushes electrons from the control gate to the storage layer. There reaches a point during erase at which the rate of removal electrons from the storage layer is the same as the rate of electrons arriving at the charge layer from the gate. When this occurs no further erasing is occurring even though a net balance of electrons remains in the charge storage layer. This phenomenon is also present to an even greater extent in silicon-oxide-nitride oxide-silicon (SONOS) memory cells.

A known approach to reduce this back-injection is to use a P-doped gate with the N-type source/drains. This device is difficult to manufacture, however, because the gate is preferably used as a mask during the source/drain implant so that the gate receives the same doping as the source/drains unless special masking steps are undertaken. The additional masking tends to make the source/drain not self-aligned to the gate. Thus, there is a need for improved techniques in achieving control gates doped to a different conductivity type than the source/drains.

BRIEF DESCRIPTION OF THE DRAWINGS

The present invention is illustrated by way of example and is not limited by the accompanying figures, in which like references indicate similar elements. Skilled artisans appreciate that elements in the figures are illustrated for simplicity and clarity and have not necessarily been drawn to scale.

DETAILED DESCRIPTION OF THE DRAWINGS

In one aspect a non-volatile memory (NVM) cell is achieved by first doping a layer of gate material to P-type that is over a charge storage layer then forming an implant masking layer over the gate material. The masking layer and the gate material can be patterned at the same time so that the implant mask is just over the control gate not the areas for the source/drains. The source/drains are then implanted with the implant mask in place over the control gate. The implant mask is chosen to be a material that is not only a mask for the source/drain implants but can be etched selective to the other materials present for making MOS transistors such as oxide, nitride, and silicon. The implant mask is removed after the implants for the source/drains so that the gate remains P-type. This is better understood by reference to the drawings and the following description.

Figure 1:
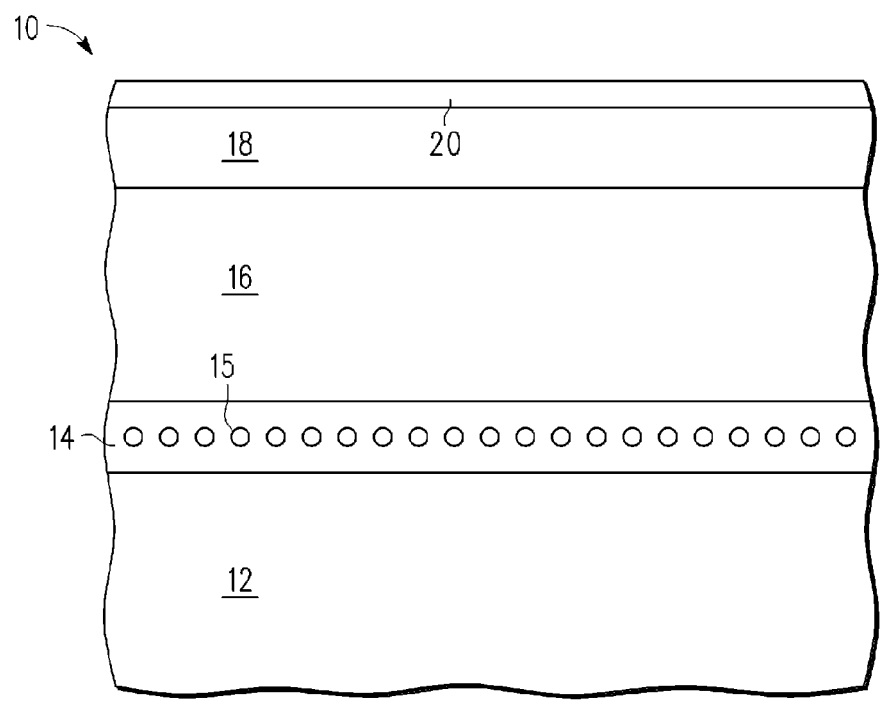
FIG. 1 is a cross-section of semiconductor device at a stage in processing according to a first embodiment.

Shown in FIG. 1 is semiconductor device 10 comprising a substrate 12, a charge storage layer 14 over substrate 12, a heavily-doped polysilicon layer 16 over charge storage layer 14, an implant blocking layer 18 over polysilicon layer 16, and an oxide layer 20 over implant blocking layer 18. Substrate 12 is preferably silicon but could be another semiconductor material such as germanium or silicon germanium (SiGe). Silicon substrate 12 is shown as a bulk silicon substrate but as one alternative could also be the top semiconductor layer in a semiconductor-on-insulator (SOI) substrate. Charge storage layer 14 comprises nanocrystals such as nanocrystal 15 insulated with insulating layers from polysilicon layer 16 and substrate 12. Nanocrystals are also called nanoclusters. Implant blocking layer 18 is preferably of silicon germanium or titanium nitride. Other materials, for example a nitrided material other than titanium nitride, may also be found to be effective. Implant blocking layer 18 should be effective in blocking an implant and should be able to be etched selective to oxide, nitride, and silicon. Implant blocking layer 18 functions as a protective layer for polysilicon layer 16 during source/drain implants. Charge storage layer 14 is preferably about 170 to 350 Angstroms thick.

Polysilicon layer 14 and implant blocking layer 18 may be the same thickness of preferably 1000 and 1500 Angstroms. Oxide layer is preferably about 100 to 300 Angstroms. Polysilicon is a common gate material.

Figure 2:
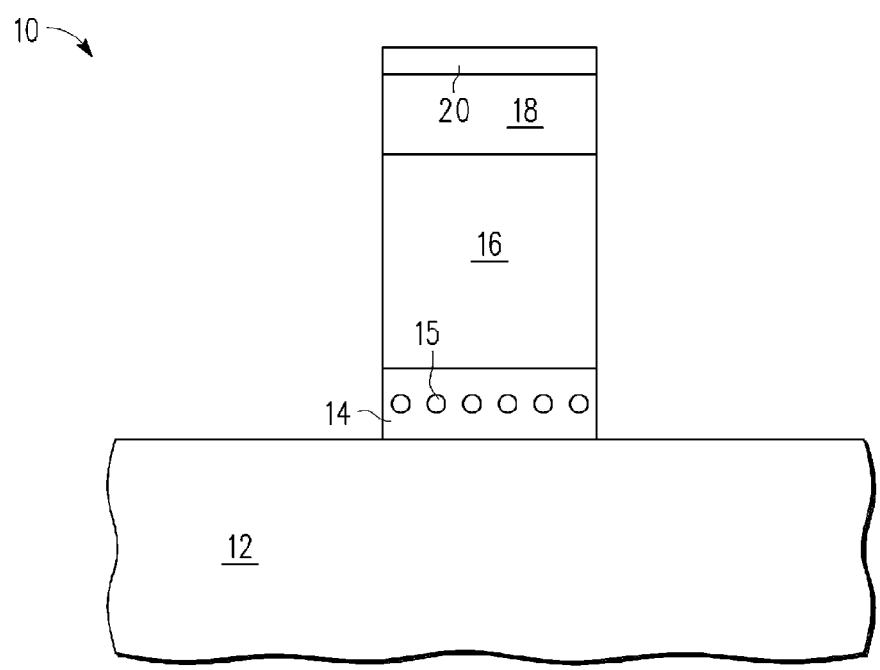
FIG. 2 is a cross-section of the semiconductor device of FIG. 1 at a subsequent stage in processing.

Shown in FIG. 2 is semiconductor device 10 after a gate patterning step of through oxide layer 20, implant blocking layer 18, polysilicon layer 16, and charge storage layer 14. This has the effect of exposing substrate 12. The remaining portion of polysilicon layer 16 is for becoming a control gate of the non-volatile memory cell that is to be formed. This etch uses a photoresist mask and may require a change in chemistry as the various layers are etched. An effective etch chemistry for implant blocking layer 18, if it is titanium nitride, is a mixture of argon and chlorine. If the implant blocking layer 18 is silicon germanium, a hydrogen bromide (HBr) chemistry may be used in an inductively coupled plasma chamber. Conventional etch chemistries for oxide, polysilicon, and charge storage layer 14 may be used. Charge storage layer 14 would typically comprise polysilicon nanocrystals and oxide but may also have different insulating materials or different nanocrystals.

Figure 3:
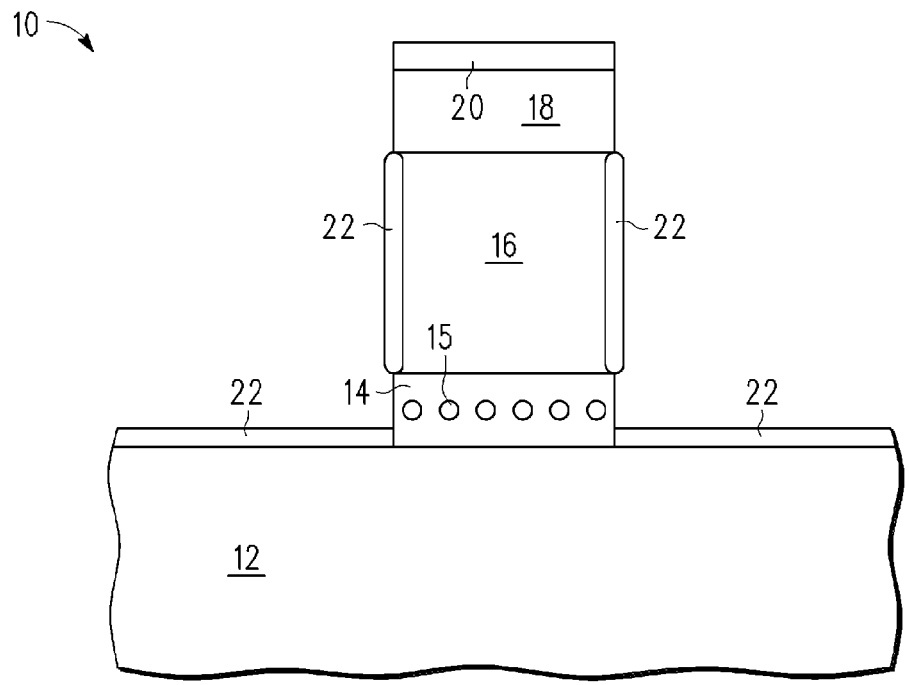
FIG. 3 is a cross-section of the semiconductor device of FIG. 2 at a subsequent stage in processing.

Shown in FIG. 3 is semiconductor device 10 after performing an oxide growth step which forms oxide layer 22 on the sides of the remaining portion of polysilicon layer 16 and exposed substrate 12.

Figure 4:
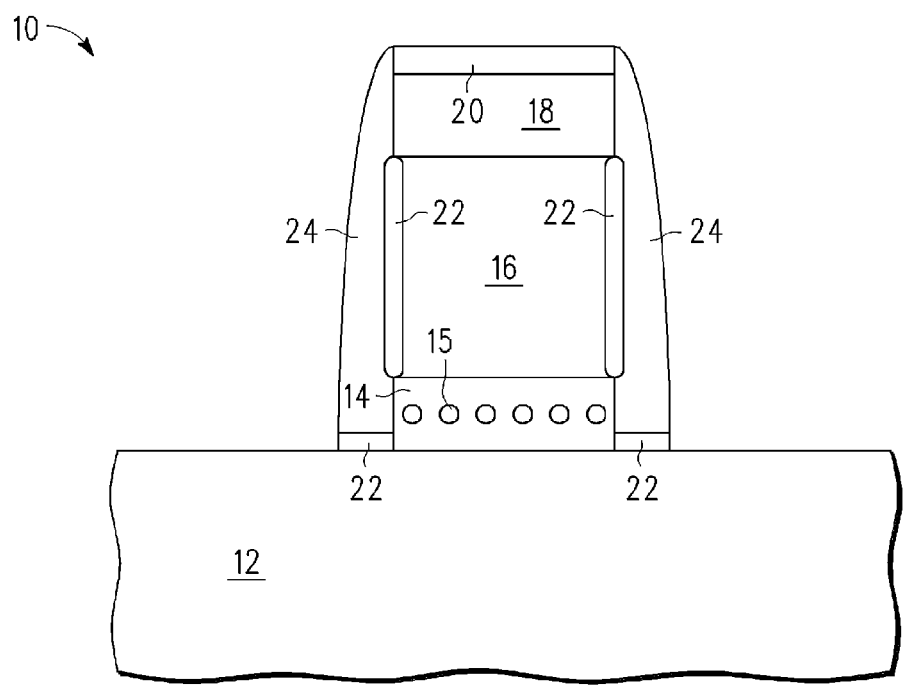
FIG. 4 is a cross-section of the semiconductor device of FIG. 3 at a subsequent stage in processing.

Shown in FIG. 4 is semiconductor device 10 after forming sidewall spacers 24 around the remaining portions of polysilicon layer 16, implant blocking layer 18, oxide layer 20, and charge storage layer 14. Sidewall spacers are preferably high temperature oxide (HTO) spacers formed in conventional spacer fashion by performing a substantially conformal deposition followed by an anisotropic etch. The anisotropic etch leaves the substrate adjacent to sidewall spacers 24 exposed. Oxide layer 20 will be thinned somewhat but will substantially remain. The bottom of sidewall spacer 24, which is on oxide layer 22, is preferably about 100 Angstroms.

Figure 5:
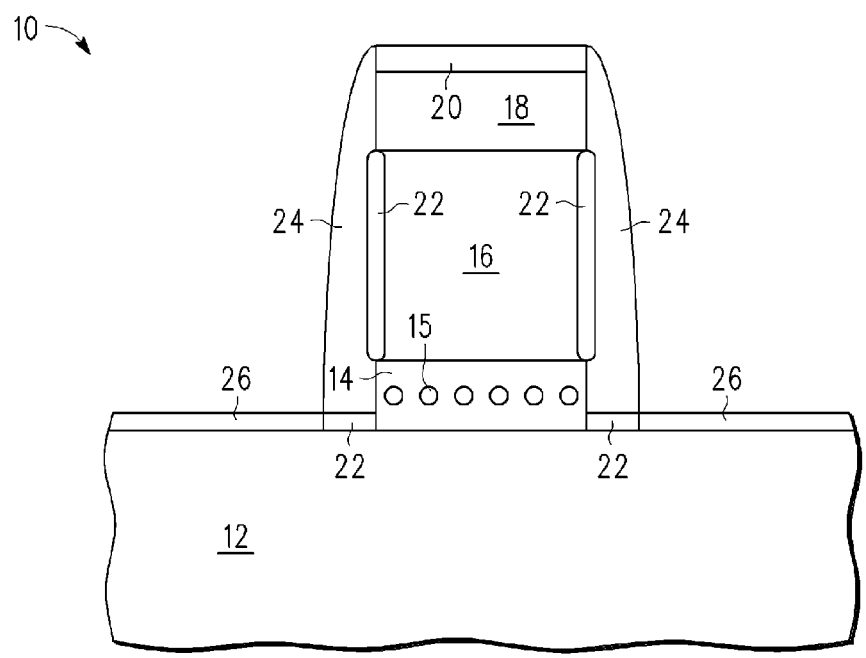
FIG. 5 is a cross-section of the semiconductor device of FIG. 4 at a subsequent stage in processing.

Shown in FIG. 5 is semiconductor device 10 after performing an oxide growth step on the exposed portions of substrate 12 to form oxide layers 26.

Figure 6:
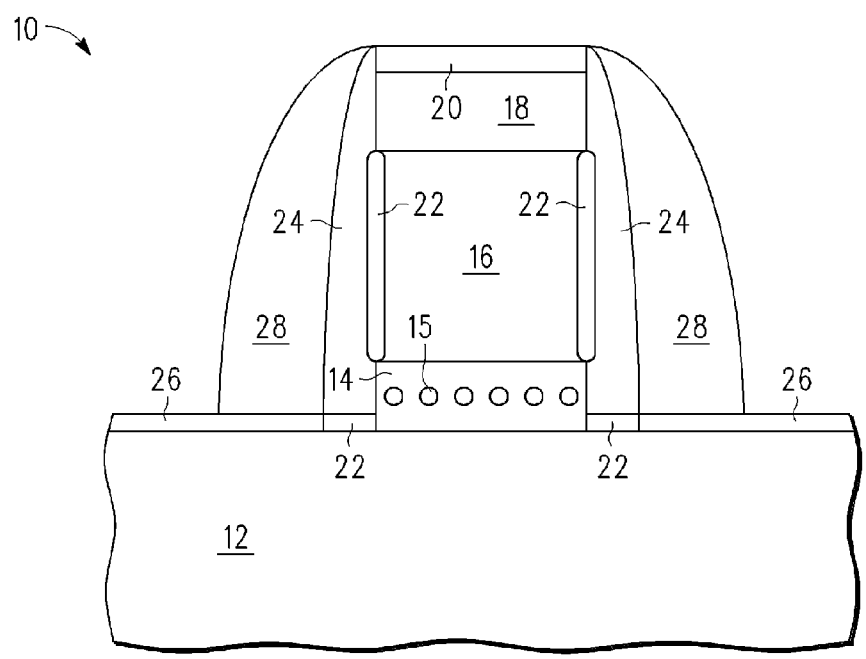
FIG. 6 is a cross-section of the semiconductor device of FIG. 5 at a subsequent stage in processing.

Shown in FIG. 6 is semiconductor device 10 after forming sidewall spacers 28 on the sides of sidewall spacer 24. Sidewall spacer 28 preferably comprises polysilicon. During the anisotropic etch that forms sidewall spacers 28, oxide layer 20 acts to prevent implant blocking layer 18 from receiving the etchant that is used in forming sidewall spacer 28.

Figure 7:
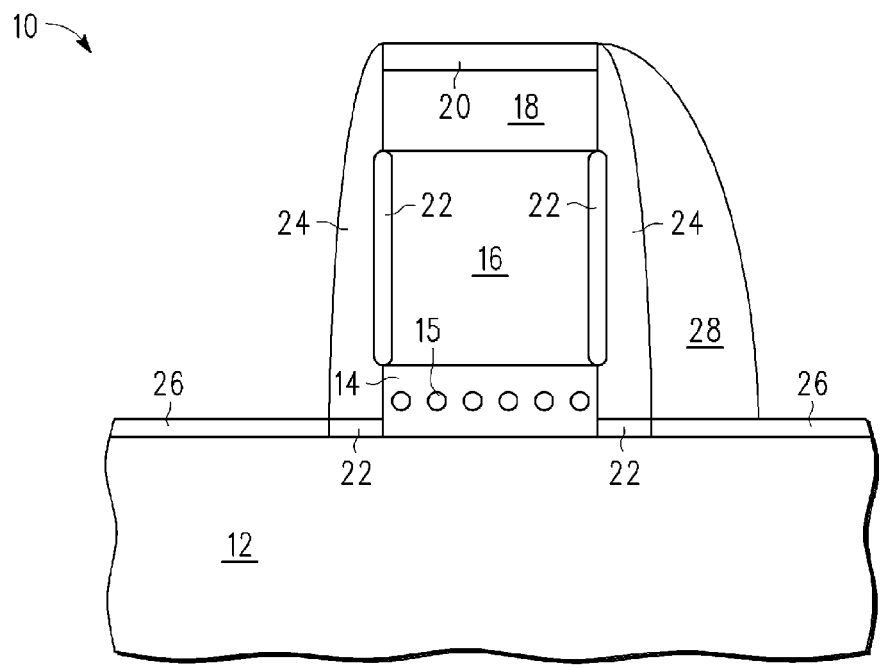
FIG. 7 is a cross-section of the semiconductor device of FIG. 6 at a subsequent stage in processing.

Shown in FIG. 7 is semiconductor device 10 after removing sidewall spacer 24 from one side of the remaining portions of polysilicon layer 16, implant blocking layer 18, oxide layer 20, and charge storage layer 14. This etch step requires a mask but it need not be a very precise one. The mask need only be sufficiently precise to avoid exposing the side of sidewall spacer 28 that is to remain, which is easily achieved. The remaining sidewall spacer 28 is for being a select gate for the NVM cell that is to be formed.

Figure 8:
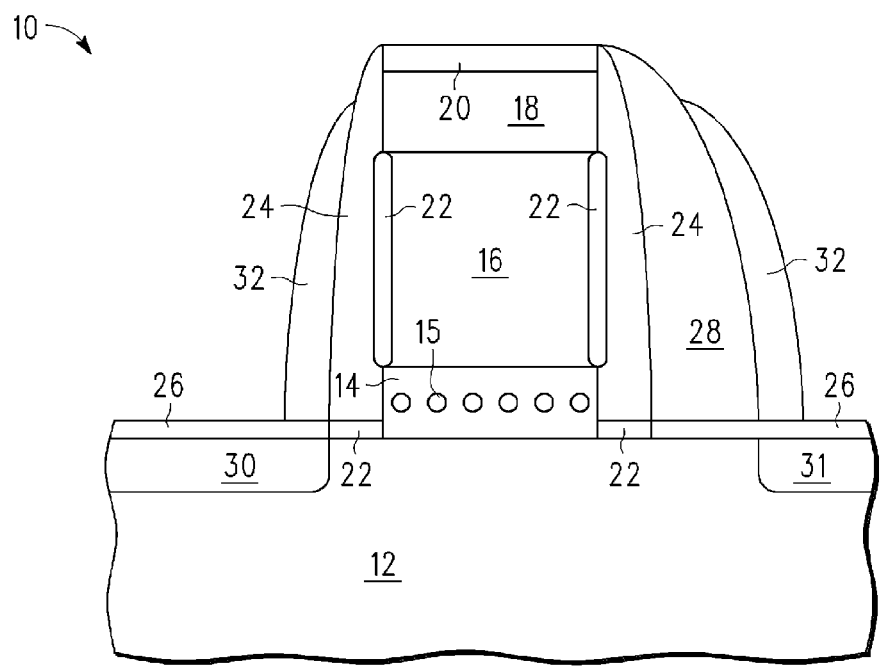
FIG. 8 is a cross-section of the semiconductor device of FIG. 7 at a subsequent stage in processing.

Shown in FIG. 8 is semiconductor device 10 after performing an extension implant of N-type dopants, preferably arsenic using sidewall spacer 24 and sidewall spacer 28 as a mask which results in the formation of drain region 30 adjacent sidewall spacer 24 and source region 31 adjacent sidewall spacer 28. Sidewall spacer 28 also becomes partially doped to N-type with this implant. Also shown in FIG. 8 is sidewall spacer 32 of nitride around sidewall spacer 24 and sidewall spacer 28.

Figure 9:
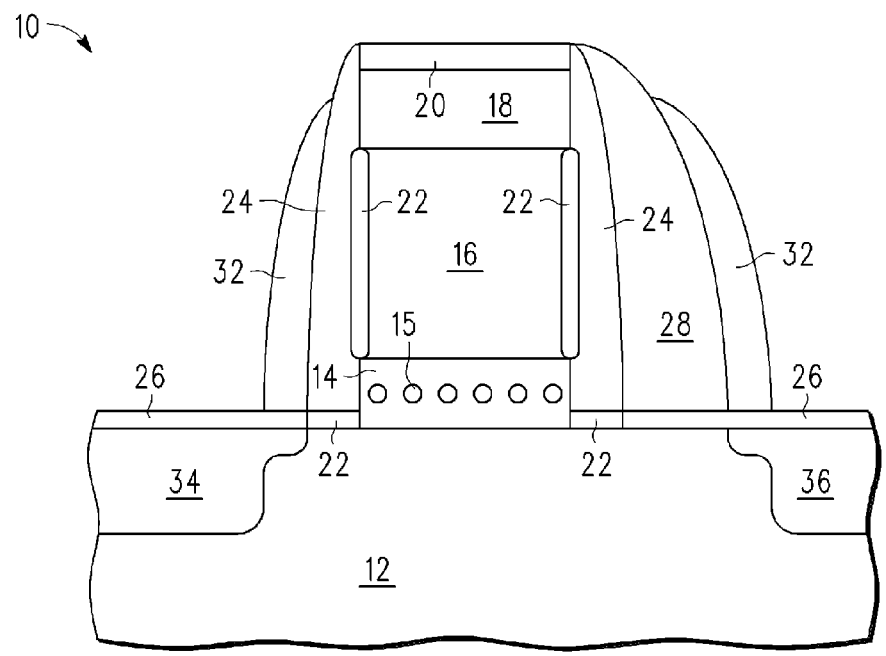
FIG. 9 is a cross-section of the semiconductor device of FIG. 8 at a subsequent stage in processing.

Shown in FIG. 9 is semiconductor device 10 after performing a deep source/drain implant that increases the doping concentration for making source/drain contacts. This implant results in drain region 34 and source region 36. The deep source/drain implant may be of either phosphorus or arsenic or both. Sidewall spacer 28 is also further N-type doped by this implant.

Figure 10:
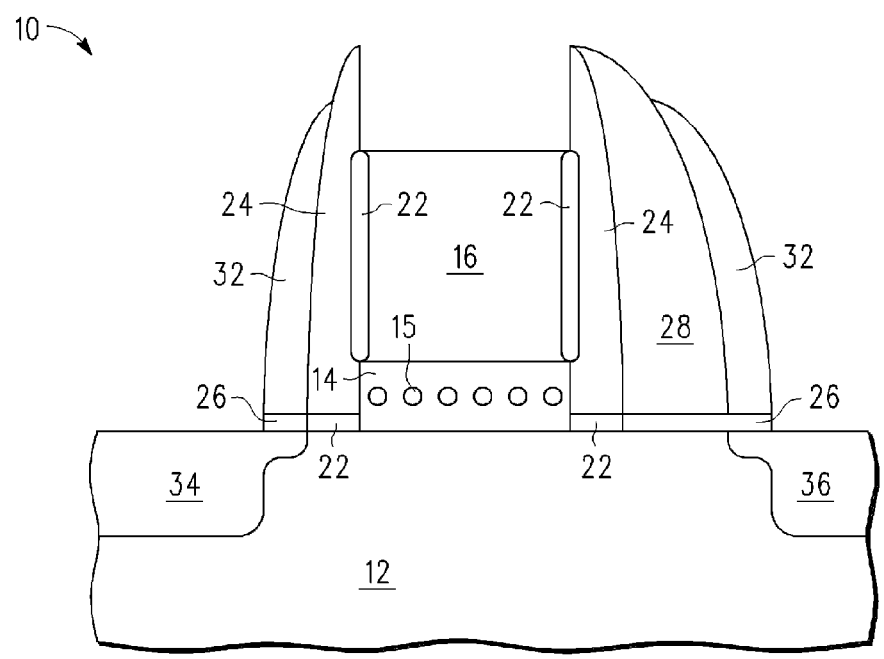
FIG. 10 is a cross-section of the semiconductor device of FIG. 9 at a subsequent stage in processing.

Shown in FIG. 10 is semiconductor device 10 after removing the remaining portions of oxide layer 20 and implant blocking layer 18. This would likely require a change in chemistries from etching oxide to etching silicon germanium or titanium nitride. Wet chemistries are preferred for removing implant blocking layer 18. At the time implant blocking layer 18 is removed, nitride from sidewall spacer 32, polysilicon from sidewall spacer 28, oxide from sidewall spacer 24, and silicon from substrate 12 are exposed. Thus the etch chemistry chosen for removing implant block layer 18 must be able to etch implant blocking layer 18 while preferably not significantly etching oxide, nitride, or silicon. This can also be stated as the etch chemistry in etching the implant blocking layer is preferably selective to oxide, nitride, and silicon. If the implant blocking layer 18 is SiGe, an RCA clean may be used for the wet etch. In one form the RCA clean is a two step process wherein the first step involves exposure to a mixture containing ammonia hydroxide, hydrogen peroxide, and water. The second step involves exposure to a mixture containing hydrochloric acid, hydrogen peroxide, and water. If the implant blocking layer 18 is TiN, a piranha clean comprising a mixture of sulphuric acid and hydrogen peroxide may be used for the wet etch.

Figure 11:
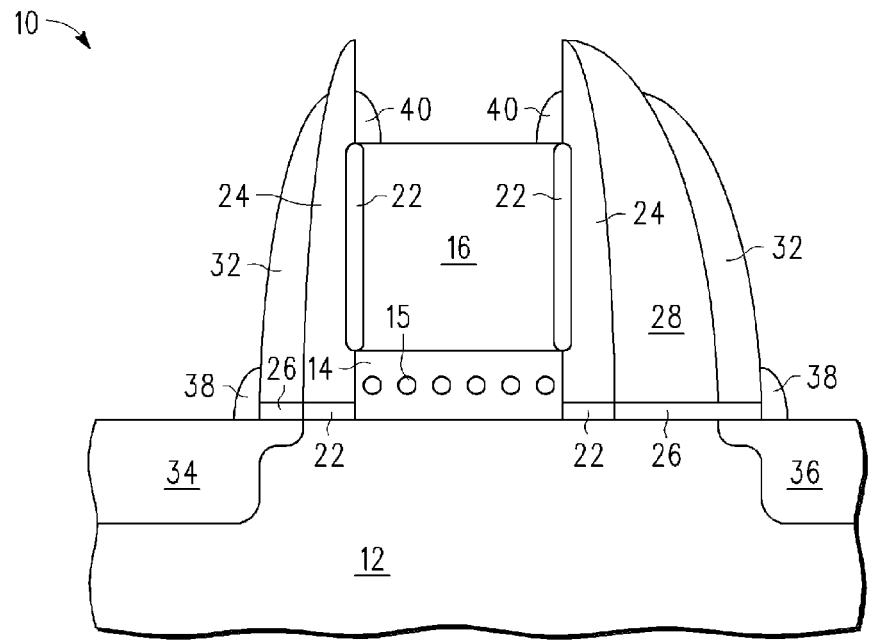
FIG. 11 is a cross-section of the semiconductor device of FIG. 10 at a subsequent stage in processing.

Shown in FIG. 11 is semiconductor device 10 after forming sidewall spacers 38 at the base sidewall spacer 32 and sidewall spacers 40 over the remaining portion of polysilicon layer 16 and adjacent to sidewall spacer 24. If the implant blocking layer 18 is SiGe, an RCA clean may be used for the wet etch. In one form the RCA clean is a two step process wherein the first step involves exposure to a mixture containing ammonia hydroxide, hydrogen peroxide, and water. The second step involves exposure to a mixture containing hydrochloric acid, hydrogen peroxide, and water. If the implant blocking layer 18 is TiN, a piranha clean comprising a mixture of sulphuric acid and hydrogen peroxide may be used for the wet etch.

Figure 12:
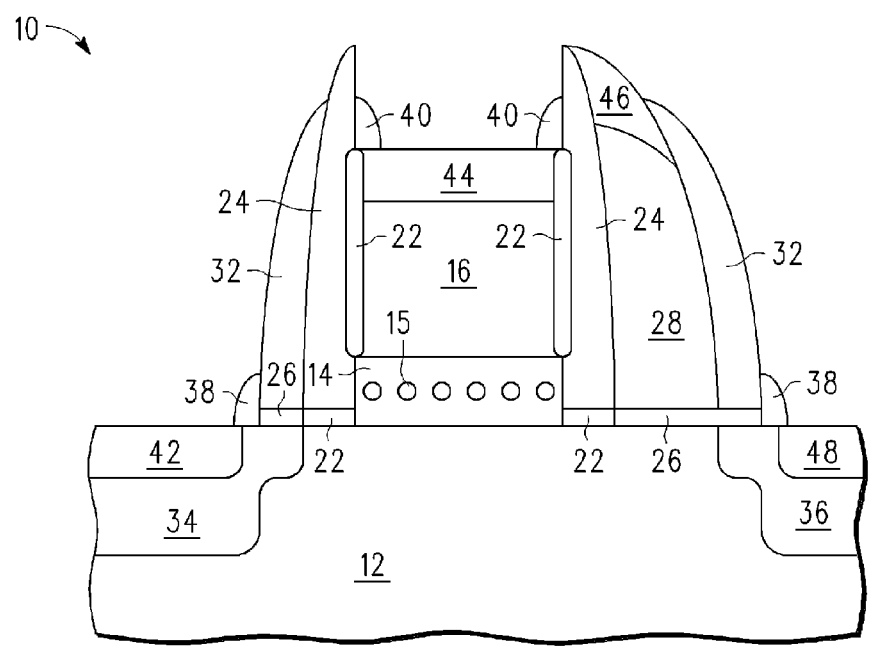
FIG. 12 is a cross-section of the semiconductor device of FIG. 11 at a subsequent stage in processing.

Shown in FIG. 12 is semiconductor device 10 after performing a silicidation step for making gate and source/drain contacts. This results in silicide region 46 in the top portion of sidewall spacer 28, a silicide region 44 in polysilicon portion 16, a silicide region 42 in drain region 34, and a silicide portion 48 in source region 36. Semiconductor device 10 in FIG. 12 shows a non-volatile memory in which the control gate is P-type and the source and drain are N-type. Sidewall spacer 28, as the select gate, is also N-type because it receives the implants that form source and drain regions 34 and 36. Sidewall spacer 28 may be in situ doped as well. Subsequent anneals cause sidewall spacer 28 to become doped more evenly to N-type. Sidewall spacer 24 provides electrical isolation between the control gate and the select gate. Source region 34 and drain region 36 are on opposing sides of the control gate.

Figure 13:
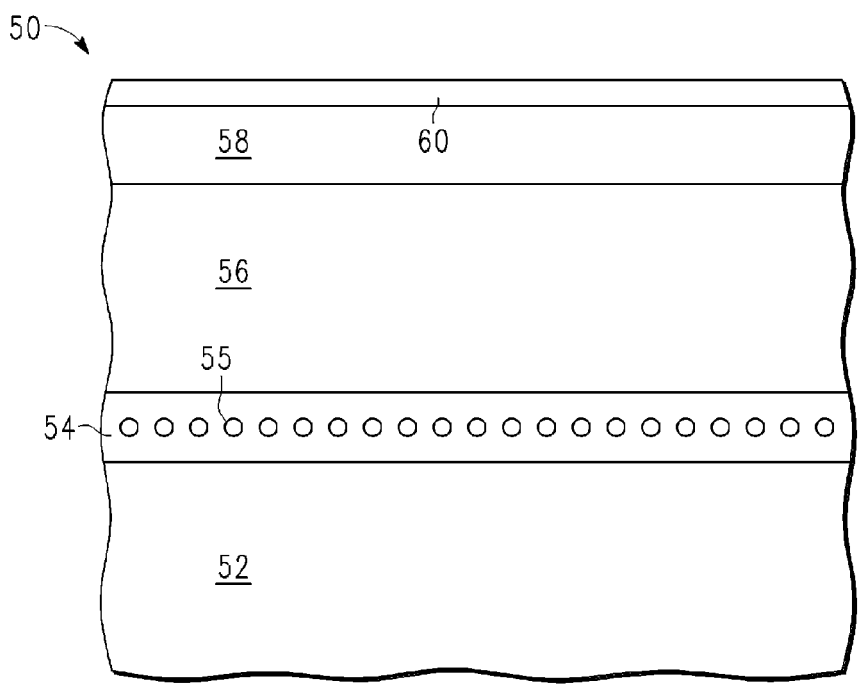
FIG. 13 is a cross-section of the semiconductor device at a stage in processing according to a second embodiment.

Shown in FIG. 13 is a semiconductor device 50 comprising a substrate 52, a charge storage layer 54 over substrate 52, a polysilicon layer 56 over charge storage layer 54, an implant blocking layer 58 over polysilicon layer 56, and an oxide layer 60 over implant blocking layer 58. As in FIG. 1, substrate 52 is preferably silicon but could be another semiconductor material such as germanium or silicon germanium. Silicon substrate 52 is shown as a bulk silicon substrate but as one alternative could also be the top semiconductor layer in a semiconductor-on-insulator (SOI) substrate. Charge storage layer 54 comprises nanocrystals such as nanocrystal 55 insulated with insulating layers from polysilicon layer 156 and substrate 52. Implant blocking layer 58 is preferably of silicon germanium or titanium nitride. Other materials may also be found to be effective. Implant blocking layer 58 should be effective in blocking an implant and should be able to be etched selective to oxide, nitride, and silicon. Charge storage layer 54 is preferably about 170 to 350Angstroms thick. Polysilicon layer 56 and implant blocking layer 58 may be the same thickness of preferably 1000 and 1500 Angstroms. Oxide layer 60 is preferably about 100 to 300 Angstroms. Polysilicon layer 56 is heavily doped to P type. This can be achieved by an implant performed prior to the deposition of implant blocking layer 58 or in situ doped. In situ doping is preferable to avoid the implant step, which would be an additional step.

Figure 14:
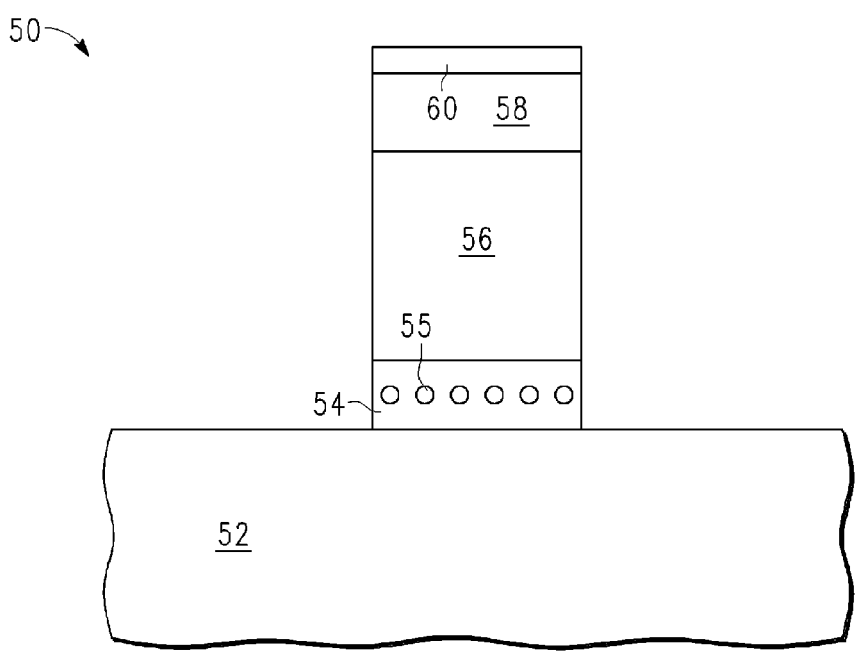
FIG. 14 is a cross-section of the semiconductor device of FIG. 13 at a subsequent stage in processing.

Shown in FIG. 14, as in FIG. 2, is semiconductor device 50 after a gate patterning step of through oxide layer 60, implant blocking layer 58, polysilicon layer 56, and charge storage layer 54. This has the effect of exposing substrate 52. The remaining portion of polysilicon layer 56 is for becoming a control gate of the non-volatile memory cell that is to be formed. This etch uses a photoresist mask and may require a change in chemistry as the various layers are etched. An effective etch chemistry for implant blocking layer 58, if it is silicon germanium or titanium nitride, is a mixture of argon and chlorine. If implant blocking layer 58 is SiGe, a hydrogen bromide (HBr) chemistry may be used in an inductively coupled plasma chamber. Conventional etch chemistries for oxide, polysilicon, and charge storage layer 54 may be used. Charge storage layer 54 would typically comprise polysilicon nanocrystals and oxide but may also have different insulating materials or different nanocrystals.

Figure 15:
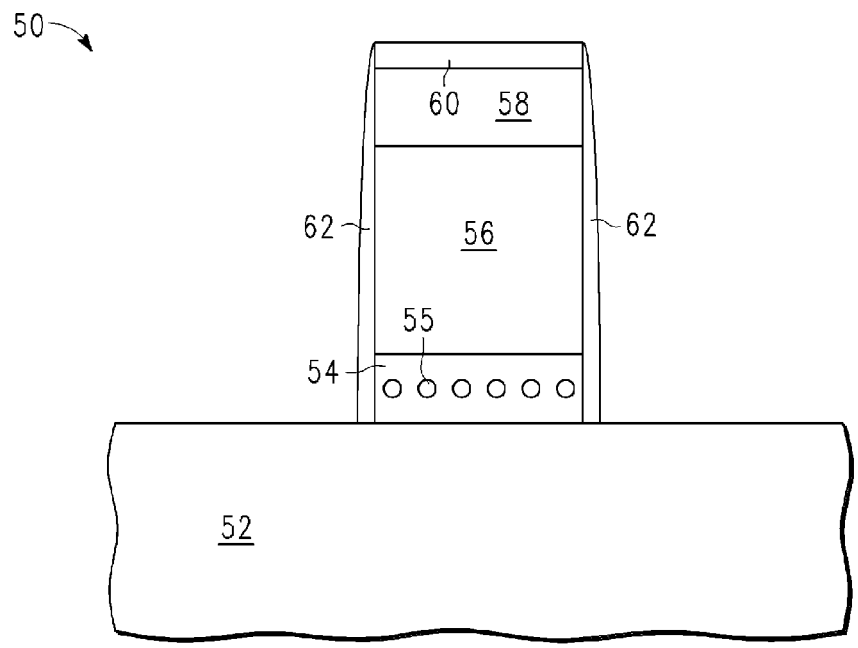
FIG. 15 is a cross-section of the semiconductor device of FIG. 14 at a subsequent stage in processing.

Shown in FIG. 15 is semiconductor device 50 after forming a sidewall spacer 62 of HTO around the remaining portions of layers 54, 56, 58, and 60. Some thinning of oxide layer 60 may occur but will substantially remain.

Figure 16:
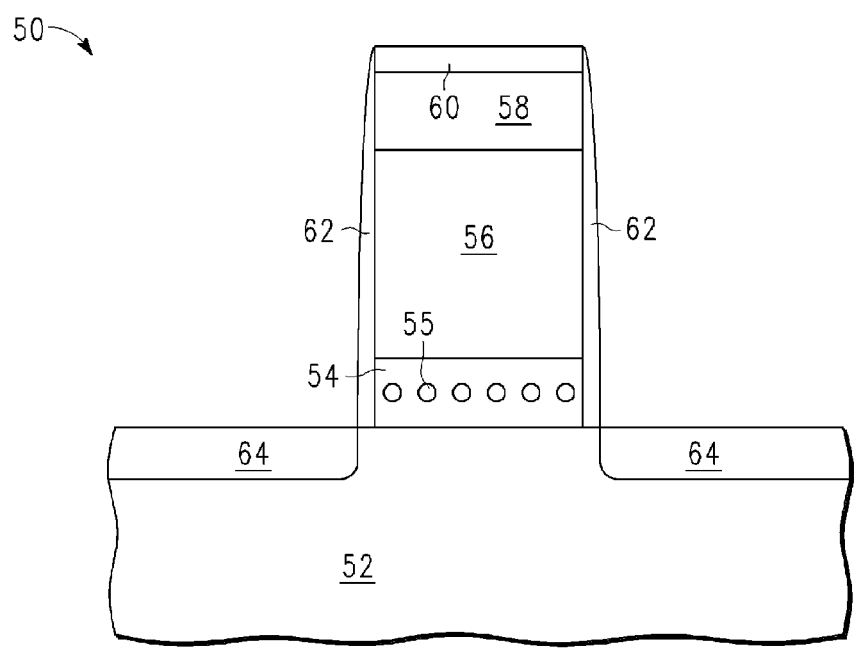
FIG. 16 is a cross-section of the semiconductor device of FIG. 15 at a subsequent stage in processing.

Shown in FIG. 16 is semiconductor device 50 after performing an N-type extension implant in which implant blocking layer 58 prevents the implant from reaching the remaining portion of polysilicon layer 56. This implant results in the formation of source/drain regions 64 adjacent to the sides of sidewall spacer 62. Since the remaining portion of polysilicon layer 56 will be the control gate and since there will be additional heating steps, source/drain regions 64 will be substantially adjacent to the control gate and have a channel therebetween.

Figure 17:
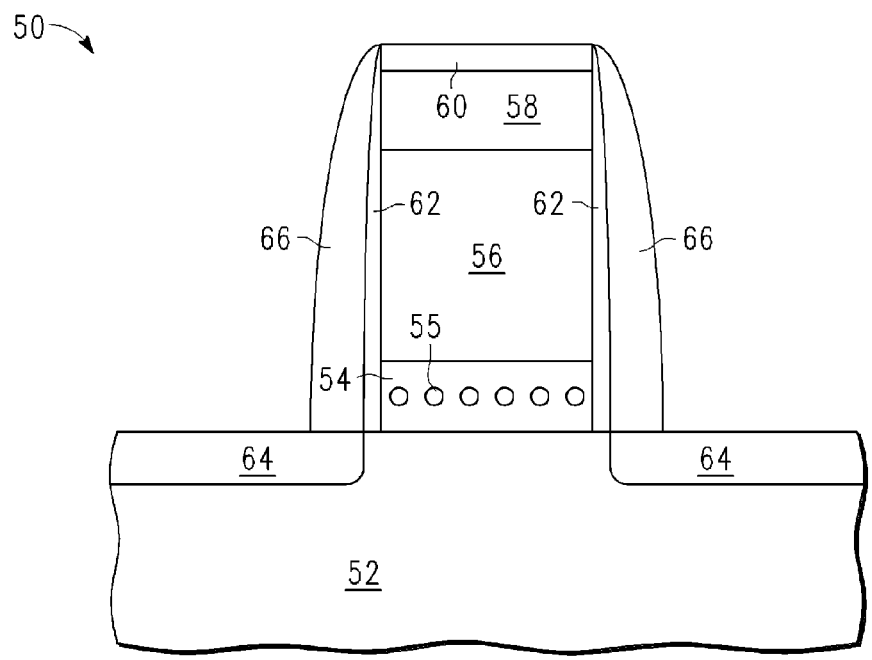
FIG. 17 is a cross-section of the semiconductor device of FIG. 16 at a subsequent stage in processing.

Shown in FIG. 17 is semiconductor device 50 after forming sidewall spacers 66 around the remaining portions of layers 54, 56, 58, and 60. This is a nitride spacer.

Figure 18:
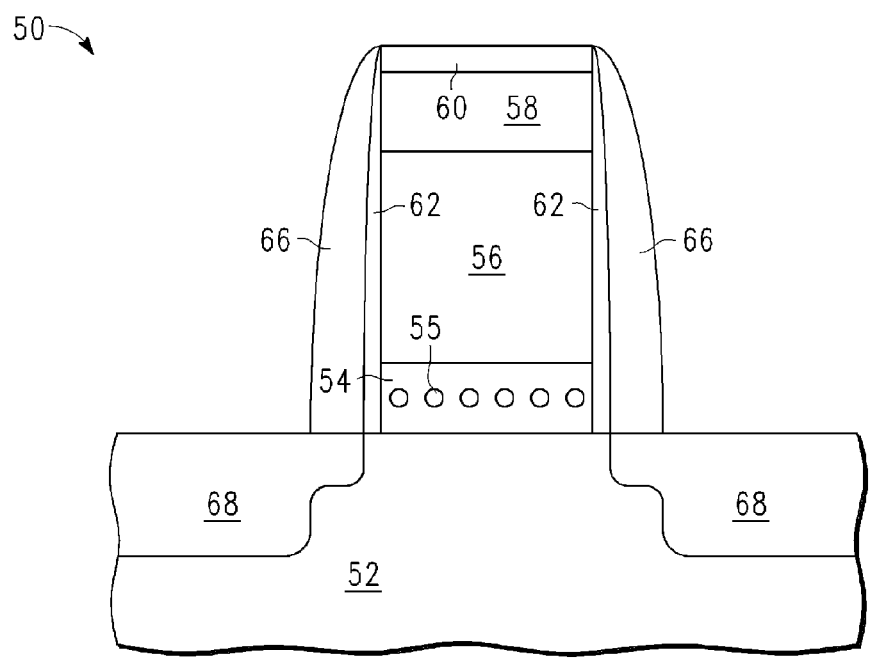
FIG. 18 is a cross-section of the semiconductor device of FIG. 17 at a subsequent stage in processing.

Shown in FIG. 18 is semiconductor device 50 after performing a deep source/drain implant to form source/drain regions 68.

Figure 19:
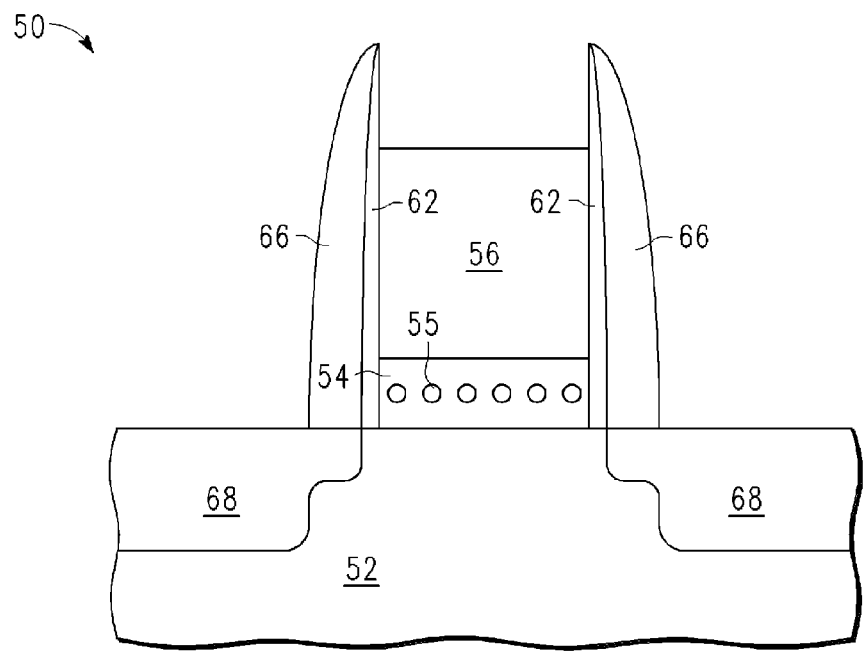
FIG. 19 is a cross-section of the semiconductor device of FIG. 18 at a subsequent stage in processing.

Shown in FIG. 19 is a semiconductor device 50 after removing oxide layer 60 and implant blocking layer 58. As in removing oxide layer 20 and implant blocking layer 18 in FIG. 10, this would likely require a change in chemistries from etching oxide to etching silicon germanium or titanium nitride. Wet chemistries are preferred for removing implant blocking layer 58. At the time implant blocking layer 58 is removed, nitride from sidewall spacer 66, oxide from sidewall spacer 24, and silicon from substrate 52 are exposed. Thus the etch chemistry chosen for removing implant block layer must be able to etch implant blocking layer 58 while preferably not significantly etching oxide, nitride, or silicon. This can also be stated as the etch chemistry in etching the implant blocking layer is preferably selective to oxide, nitride, and silicon. If the implant blocking layer 18 is SiGe, an RCA clean may be used for the wet etch. In one form the RCA clean is a two step process wherein the first step involves exposure to a mixture containing ammonia hydroxide, hydrogen peroxide, and water. The second step involves exposure to a mixture containing hydrochloric acid, hydrogen peroxide, and water. If the implant blocking layer 18 is TiN, a piranha clean comprising a mixture of sulphuric acid and hydrogen peroxide may be used for the wet etch.

Figure 20:
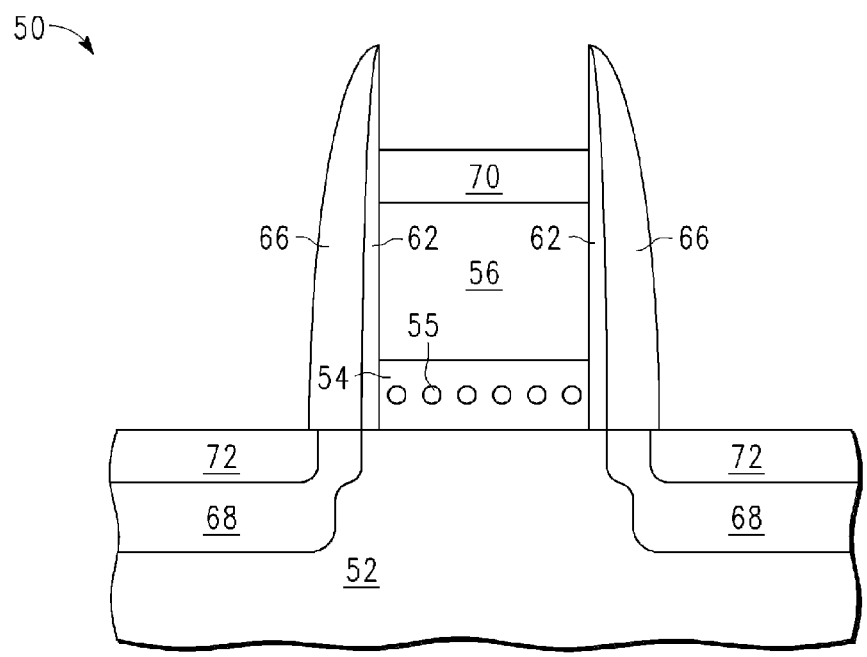
FIG. 20 is a cross-section of the semiconductor device of FIG. 19 at a subsequent stage in processing.

Shown in FIG. 20 is semiconductor device 50 after forming silicide region 70 in the remaining portion of layer 56 and silicide regions 72 in substrate 52 and in source/drains 68. Semiconductor device 50 of FIG. 20 is an NVM cell with silicided source/drains, silicided control gate, and a P-type control gate.

With P type doping in the gates, there are very few electrons in the gate and hence there is negligible electron transfer or flux to the charge storage layers 14 or 54 from the gate. This is achieved by a process that, in one embodiment has a benefit of the control gate being self-aligned to the drain and the select gate self-aligned to the source and, in another embodiment, the source and drain self-aligned to the control gate. The removal of the implant blocking layer in both described embodiments is achieved by employing a chemistry that is selective to the exposed other elements. This allows for a non-mask removal of the implant masking layer so that contact to the control gate can be easily made.

In the foregoing specification, the invention has been described with reference to specific embodiments. However, one of ordinary skill in the art appreciates that various modifications and changes can be made without departing from the scope of the present invention as set forth in the claims below. For example, another chemistry than that described may be used to etch the blocking layer selective to the exposed other features. Additional steps may be performed such as a thin oxide layer may be grown on the polysilicon sidewall spacer prior to forming the nitride sidewall spacer. Accordingly, the specification and figures are to be regarded in an illustrative rather than a restrictive sense, and all such modifications are intended to be included within the scope of the present invention.

Benefits, advantages, solutions to problems, and any element(s) that may cause any benefit, advantage, or solution to occur or become more pronounced are not to be construed as a critical, required, or essential feature or element of any or all the claims. The terms "a" or "an", as used herein, are defined as one or more than one even if other elements are clearly stated as being one or more in the claims or specification. The term "plurality", as used herein, is defined as two or more than two. The term another, as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:

1. A method for forming a nonvolatile memory device using a semiconductor substrate, comprising:

forming a charge storage layer, the charge storage layer comprising a material that stores electrical charge;

forming a control gate electrode overlying the charge storage layer;

forming a protective layer overlying the control gate electrode, the protective layer permitting etch selectivity by being able to be etched by an etchant that does not etch oxide, silicon and nitride;

forming a first sidewall spacer adjacent the control gate electrode;

forming a second sidewall spacer adjacent the first sidewall spacer;

removing the second sidewall spacer from one side of the control gate electrode while leaving a remainder second sidewall spacer adjacent an opposing side of the control gate electrode;

forming first and second current electrode regions in the semiconductor substrate respectively aligned to an outer edge of the first sidewall spacer and to an outer edge of the second sidewall spacer;

forming a select gate electrode from the remainder second sidewall spacer;

removing the protective layer overlying the control gate electrode; and making electrical contact to the control gate electrode, the select gate electrode and the first and second current electrode regions.

2. The method of claim 1 further comprising forming the charge storage layer as a layer of nanoclusters.

3. The method of claim 1 wherein forming the protective layer further comprises:

forming a first layer of material, the first layer comprising either silicon germanium or a nitrided material; and forming a second layer of material overlying the first layer of material, the second layer of material comprising an oxide.

4. The method of claim 1 further comprising:

forming the first sidewall spacer from a dielectric material; and forming the second sidewall spacer from a conductive material.

5. The method of claim 1 further comprising:

forming a third sidewall spacer adjacent the remainder second sidewall spacer and exposed portions of the first sidewall spacer, the third sidewall spacer comprising a dielectric material.

6. The method of claim 5 further comprising:

forming a fourth sidewall spacer overlying a portion of the control gate electrode and adjacent an exposed inner sidewall of the first sidewall spacer, the fourth sidewall spacer comprising electrically insulating material; and forming a fifth sidewall spacer laterally outside the third sidewall spacer, the fifth sidewall spacer also comprising electrically insulating material.

7. A method for forming a nonvolatile memory device using a semiconductor substrate, comprising:

forming a charge storage layer overlying the semiconductor substrate;

forming a control gate electrode overlying the charge storage layer;

forming a protective layer overlying the control gate electrode comprising a material that provides etch selectivity by being able to be etched by an etchant that does not etch oxide, silicon and nitride;

forming an insulating sidewall spacer adjacent exposed sides of the charge storage layer, the control gate electrode and the protective layer;

forming first and second current electrode regions in the semiconductor substrate aligned to opposite sides of the control gate electrode, the first and second current electrode regions being formed by dopants that are blocked from the control gate electrode by the protective layer;

removing the protective layer from above the control gate electrode by the etchant that does not etch oxide, silicon and nitride to leave the insulating sidewall spacer extending above the control gate electrode; and making electrical contact to the control gate electrode and the first and second current electrode regions, wherein forming the insulating sidewall spacer further comprises forming an oxide sidewall spacer adjacent sidewalls of the charge storage layer, the control gate electrode and the protective layer followed by forming a nitride sidewall spacer adjacent the oxide sidewall spacer and further removed from the control gate electrode than the oxide sidewall spacer.

8. The method of claim 7 further comprising using one of silicon germanium or titanium nitride as the protective layer.

9. The method of claim 7 wherein forming the protective layer further comprises:

forming a first layer of material, the first layer comprising either silicon germanium or a nitrided material; and forming a second layer of material overlying the first layer of material, the second layer of material comprising an oxide.

10. The method of claim 7 wherein forming the charge storage layer further comprises forming a plurality of nanoclusters in an oxide layer.

11. The method of claim 7 wherein forming the control gate electrode further comprises forming a P conductivity polysilicon layer of material for the control gate electrode prior to forming the protective layer, and the nonvolatile memory device is subjected to dopants which transform the first and second current electrode regions into N conductivity regions without using a masking layer and without modifying the P conductivity polysilicon layer of material.

12. A method for forming a nonvolatile memory device using a semiconductor substrate, comprising:

forming a charge storage layer overlying the semiconductor substrate;

forming a control gate electrode overlying the charge storage layer;

forming a protective layer overlying the control gate electrode comprising a material that provides etch selectivity by being able to be etched by an etchant that does not etch oxide, silicon and nitride;

forming an insulating sidewall spacer adjacent exposed sides of the charge storage layer, the control gate electrode and the protective layer;

forming first and second current electrode regions in the semiconductor substrate aligned to opposite sides of the control gate electrode, the first and second current electrode regions being formed by dopants that are blocked from the control gate electrode by the protective layer;

removing the protective layer from above the control gate electrode by the etchant that does not etch oxide, silicon and nitride to leave the insulating sidewall spacer extending above the control gate electrode; and making electrical contact to the control gate electrode and the first and second current electrode regions, wherein forming the control gate electrode further comprises forming a P conductivity polysilicon layer of material for the control gate electrode prior to forming the protective layer, and the nonvolatile memory device is subjected to dopants which transform the first and second current electrode regions into N conductivity regions without using a masking layer and without modifying the P conductivity polysilicon layer of material.

* * * * *